United States Patent
Sato et al.

(10) Patent No.: US 7,071,719 B2
(45) Date of Patent: Jul. 4, 2006

(54) SEMICONDUCTOR DEVICE

(75) Inventors: Tsunehiro Sato, Yokohama (JP); Kiyotaka Hayashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 350 days.

(21) Appl. No.: 10/353,272

(22) Filed: Jan. 28, 2003

(65) Prior Publication Data

US 2003/0141588 A1 Jul. 31, 2003

(30) Foreign Application Priority Data

Jan. 28, 2002 (JP) ............... 2002-019131

(51) Int. Cl.
*G01R 31/02* (2006.01)

(52) U.S. Cl. ..................... 324/763

(58) Field of Classification Search ............... 324/760, 324/765, 158.1; 257/680, 723, 778; 361/704
See application file for complete search history.

(56) References Cited

U.S. PATENT DOCUMENTS

| | | | |
|---|---|---|---|
| 6,055,655 A | 4/2000 | Momohara | |
| 6,122,171 A * | 9/2000 | Akram et al. | 361/704 |
| 6,437,589 B1 * | 8/2002 | Sugano | 324/763 |
| 6,597,187 B1 * | 7/2003 | Eldridge et al. | 324/754 |
| 6,684,345 B1 * | 1/2004 | Harari et al. | 714/8 |
| 6,774,478 B1 * | 8/2004 | Eto et al. | 257/686 |

FOREIGN PATENT DOCUMENTS

| | | |
|---|---|---|
| JP | 62-237741 | 10/1987 |
| JP | 5-13662 | 1/1993 |
| JP | 10-65104 | 3/1998 |
| JP | 2001-250908 | 9/2001 |

* cited by examiner

*Primary Examiner*—Jermele Hollington
*Assistant Examiner*—Tung X. Nguyen
(74) *Attorney, Agent, or Firm*—Hogan & Hartson LLP

(57) ABSTRACT

A semiconductor device includes at least three circuit substrates laid one upon another. The device further includes first circuit elements mounted, respectively, on at least two of the three circuit substrates. It also includes a second circuit element mounted on one of the three circuit substrates and configured to change connection between the first circuit elements.

10 Claims, 6 Drawing Sheets

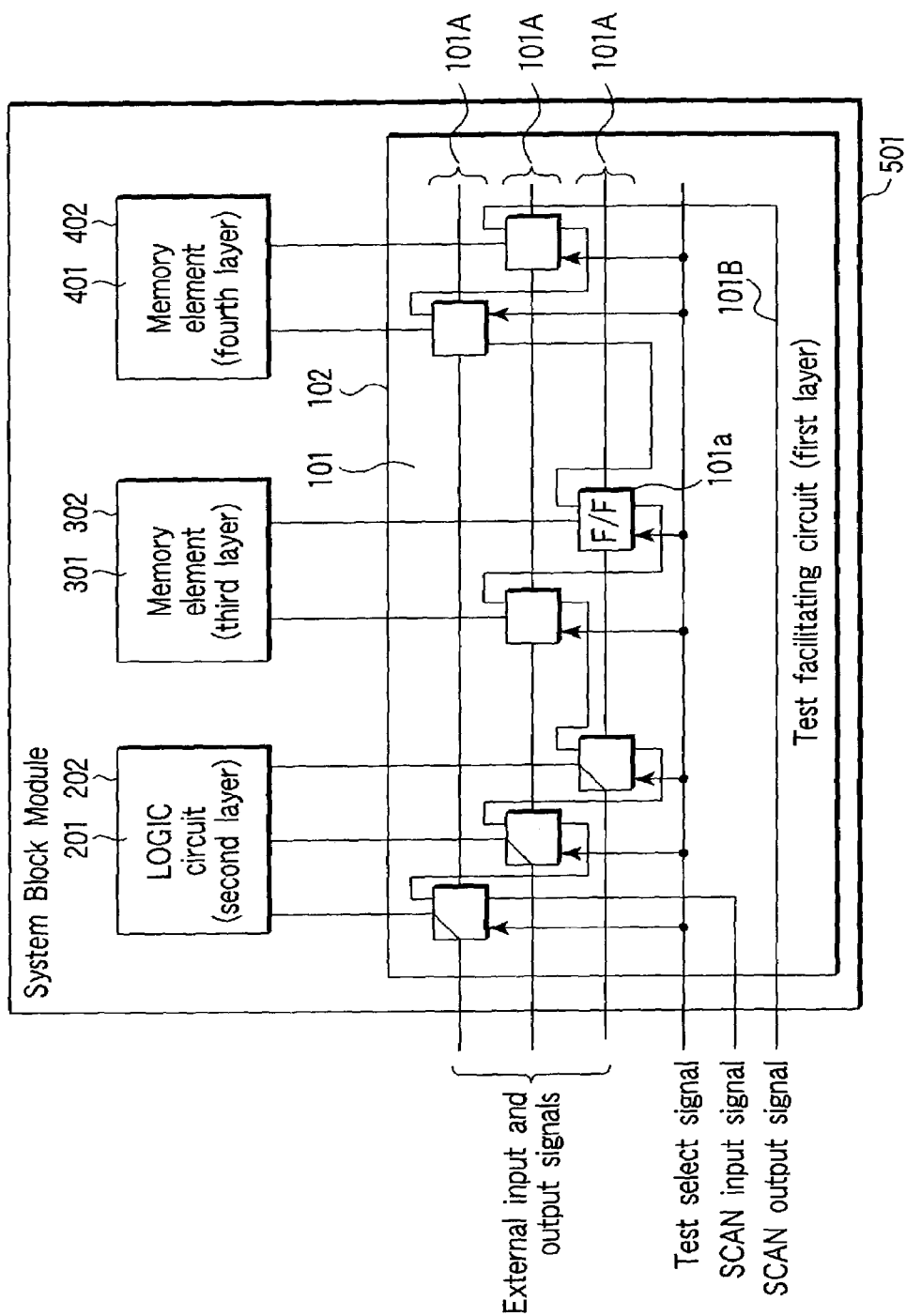
F I G. 5

US 7,071,719 B2

SEMICONDUCTOR DEVICE

CROSS-REFERENCE TO RELATED APPLICATIONS

This application is based upon and claims the benefit of priority from the prior Japanese Patent Application No. 2002-019131, filed Jan. 28, 2002, the entire contents of which are incorporated herein by reference.

BACKGROUND OF THE INVENTION

1. Field of the Invention

This invention relates to a semiconductor device composed of a plurality of circuit substrates stacked one on top of another, each circuit substrate provided with at least one circuit element. More particularly, this invention relates to a different-types-embedded semiconductor package (SBM (System Block Module)), such as an SiP (System in a Package) formed by squeezing a logic circuit and different types of semiconductor parts, including memory elements and analog elements, into a package.

2. Description of the Related Art

In recent years, an SBM composed of different types of semiconductor parts stacked one on top of another in a single package has been developed. The SBM has attracted attention because it is available in a smaller-sized package than an existing MCM (multi-chip module) composed of a plurality of chips arranged two-dimensionally.

FIG. 6 shows an example of the configuration of a conventional SBM. In the figure, the configuration of an SBM is shown two-dimensionally, using a case where a memory controller circuit and a memory element are combined. As shown in FIG. 6, in the SBM, a first circuit substrate layer 1 and a second circuit substrate layer 2 are arranged three-dimensionally. Then, the peripheries of the first circuit substrate layer 1 and second circuit substrate layer 2 are sealed with a package 3. In this example, the first circuit substrate layer 1 has a memory controller circuit on it. The second circuit substrate layer 2 has a memory clement on it.

In the SBM, existing finished semiconductor parts, such as memory controller circuits or memory elements, are mounted as they are on individual circuit substrates. Then, circuit substrates on each of which a semiconductor part is mounted are stacked one on top of another. This makes it possible to squeeze the substrates into a smaller-sized package as described above. As compared with an ordinary memory-embedded package, the SBM can be developed in a shorter time, which helps reduce the cost. That is, in the case of existing memory-embedded packages, each time a product is developed, a logic circuit and other related circuits have to be designed. Therefore, the commercialization of the product requires a very long time and a lot of funds.

The SBM with the above configuration has the advantage of being capable of carrying out a comprehensive test of the entire system easily (in the normal operation test mode). However, it is difficult for the SBM to test the memory element independently. The reason is that, in a conventional SBM, the input and output signals of the memory controller circuit are connected with the input and output signals of the memory element in a complicated manner. Therefore, it is difficult to test the memory element directly without a help of the memory controller circuit.

A method of testing the memory element independently is as follows. For example, a special input pin connected to the memory element is provided separately from the input pin used for inputting an input signal to the SBM. Use of the special input pin different from the input pin connected to the memory controller circuit enables the input signal to be inputted directly to the memory element (see FIG. 6). This makes it possible to test only the memory element easily (a conventional single-unit test mode). However, when special input pins for testing memory elements independently are provided, the number of input and output pins of the SBM increases. This causes the problem of increasing the package size (impairing the advantage of the small package size).

BRIEF SUMMARY OF THE INVENTION

According to an aspect of the present invention, there is provided a semiconductor device comprising: at least three circuit substrates laid one upon another; first circuit elements mounted, respectively, on at least two of the at least three circuit substrates; and a second circuit element mounted on one of the at least three circuit substrates and configured to change connection between the first circuit elements.

BRIEF DESCRIPTION OF THE SEVERAL VIEWS OF THE DRAWING

FIG. 5 is a block diagram showing the configuration of the SBM of FIG. 3A more concretely.

DETAILED DESCRIPTION OF THE INVENTION

Hereinafter, referring to the accompanying drawings, embodiments of the present invention will be explained.

FIRST EMBODIMENT

Figure 1A:
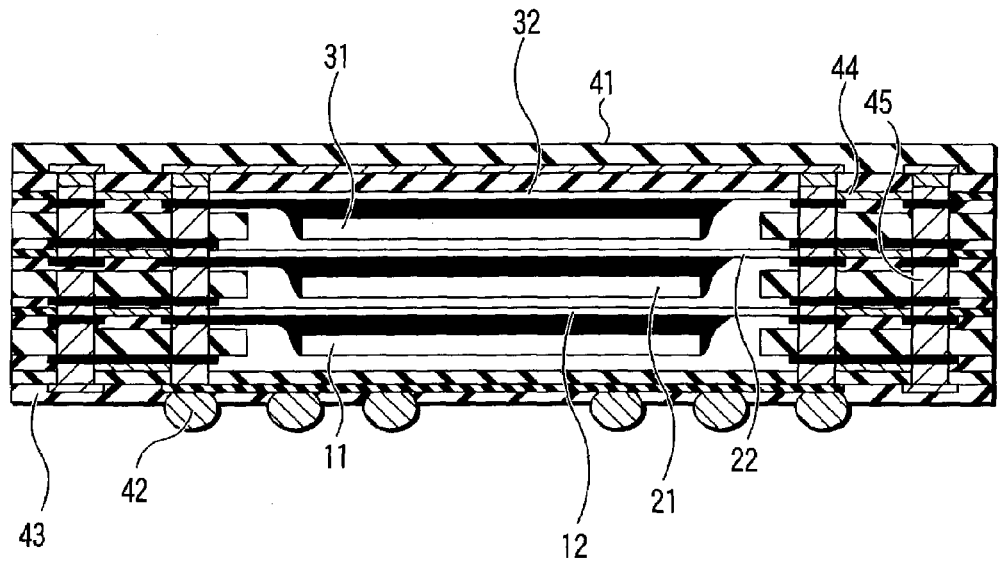
FIG. 1A is a sectional view showing a configuration of an SBM according to a first embodiment of the present invention.
Figure 1B:
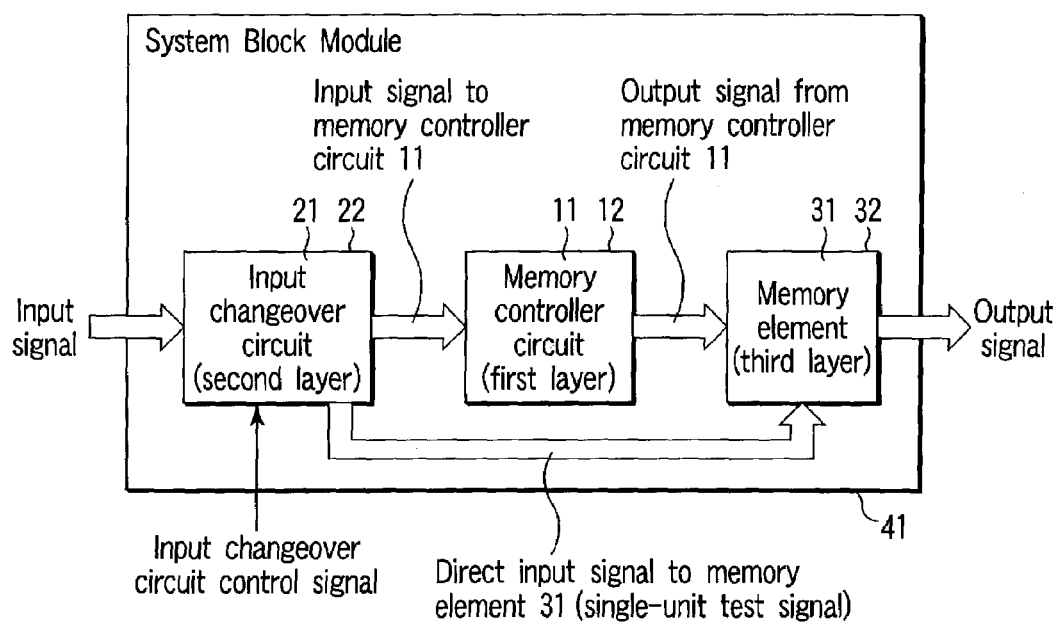
FIG. 1B is a block diagram showing the configuration of the SBM of FIG. 1A two-dimensionally.

FIGS. 1A and 1B show a schematic configuration of an SBM according to a first embodiment of the present invention. A case where a memory controller circuit and a memory clement are combined will be explained below. FIG. 1A is a sectional view of an SBM. FIG. 1B shows the arrangement of the individual layers in the SBM two-dimensionally. As shown in FIG. 1A, in the SBM, a first circuit substrate layer (a first circuit substrate) 12, a second circuit substrate layer (a third circuit substrate) 22 serving as a facilitation layer, and a third circuit substrate layer (a second circuit substrate) 32 are arranged three-dimensionally. Then, the peripheries of the first circuit substrate layer 12, second circuit substrate layer 22, and third circuit substrate layer 32 are sealed with a package 41. In the first embodiment, the first circuit substrate layer 12 has a memory controller circuit (a first circuit element) 11 on it.

The second circuit substrate layer 22 has an input changeover circuit 21 on it. The third circuit substrate layer 32 has a memory element (a second circuit element) 31 on it. The memory controller circuit 11 and the memory element 31, which are semiconductor parts of different types, are both finished products.

An input and output terminal layer 43 is provided at the lowest layer of the package 41. The input and output terminal layer 43 has a large number of input and output pins 42. The SBM exchanges the input and output signals with the external device via the input and output pins 42 on the input and output terminal layer 43. The individual layers 12, 22, 32, 43 are connected electrically to each other in a suitable manner by means of interconnection lines 44 and contacts 45 formed in via holes or through holes.

The second circuit substrate layer 22 is composed of, for example, PTP (Paper Thin Package). The input changeover circuit 21 on the second circuit substrate layer 22 changes the input to the memory element 31 on the basis of an input changeover circuit control signal inputted from the external device. For example, in the normal operation mode/normal operation test mode, the input changeover circuit 21 supplies the output signal of the memory controller circuit 11 to the memory element 31. In the single-unit test mode, the input changeover circuit 21 supplies an independent single test signal (or direct input signal) from an LSI tester (or test circuit) (not shown) external the SBM to the memory element 31. That is, the input signal supplied to the input and output pins 42 are inputted to the memory controller circuit 11 in the normal operation mode/normal operation test mode. On the other hand, when the input signals supplied to the input and output pins 42 are independent test signals (in the single-unit test mode), they are inputted directly to the memory element 31 without passing through the memory controller circuit 11.

Figure 2:
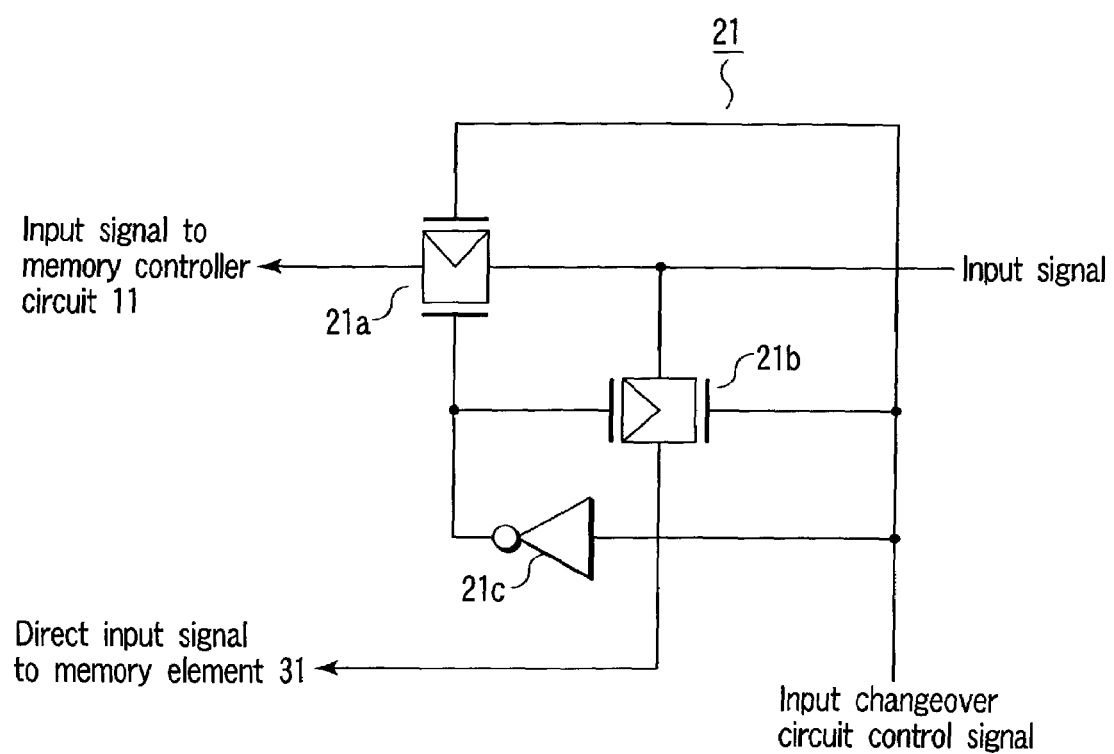
FIG. 2 shows a configuration of the input changeover circuit shown in FIGS. 1A and 1B.

FIG. 2 shows an example of the configuration of the input changeover circuit 21 used in the SBM. In this example, the input changeover circuit 21 is composed of two transfer gates 21a, 21b and an inverter circuit 21c. For example, when the input changeover circuit control signal is at the low level, the transfer gate 21a is in the on state and the transfer gate 21b is in the off state. This causes the input signals supplied to the input output pins 42 to be inputted to the memory controller circuit 11 (in the normal operation mode/ normal operation test mode). As a result, a test of the memory element 31 (or a comprehensive test of the entire system) can be carried out under the control of the memory controller circuit 11. On the other hand, when the input changeover circuit control signal is at the high level, the transfer gate 21a is in the off state and transfer gate 21b is in the on state. This causes the input signals supplied to the input and output pins 42 to be inputted directly to the memory element 31 (in the single-unit test mode). As a result, it is possible to test the memory element 31 independently.

With this configuration, the memory element 31 can be tested independently. At that time, there is no need to increase the number of input and output pins 42 considerably. Since only the memory element 31 is tested, it is not necessary to provide a special test circuit in the SBM. That is, after finished products are stacked one on top of another and squeezed into a package, externally supplied test signal are supplied directly from the input and output pins 42, which makes it easy to test the memory element 31. At that time, there is no need to make modifications to the memory controller circuit 11 and memory element 31, which are semiconductor parts of different types. Therefore, not only can the development time (TAT) of the SBM be shortened, but also defects in the semiconductor parts can be found very easily.

Furthermore, the input changeover circuit 21 provided in the interface of the memory element 31 is composed of a PTP and added in the form of a circuit substrate layer. Therefore, although the number of stacked layers increases by one (in this example, the number of stacked layers increases from 2 to 3), an increase in the number of input and output pins is minimized. As a result, the package size hardly increases and therefore the mounting area hardly increases.

SECOND EMBODIMENT

Figure 3A:
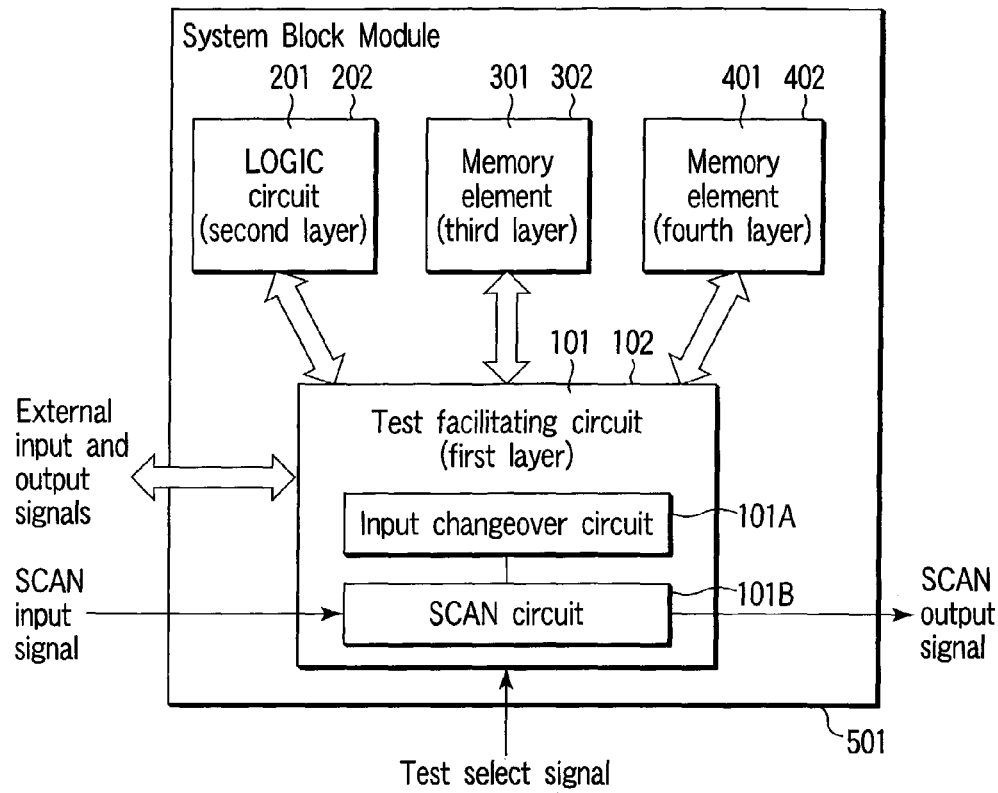
FIG. 3A is a block diagram showing two-dimensionally the configuration of an SBM according to a second embodiment of the present invention and FIG. 3B is a block diagram showing two-dimensionally the configuration of a conventional SBM in comparison with the SBM shown in FIG. 3A.
Figure 3B:
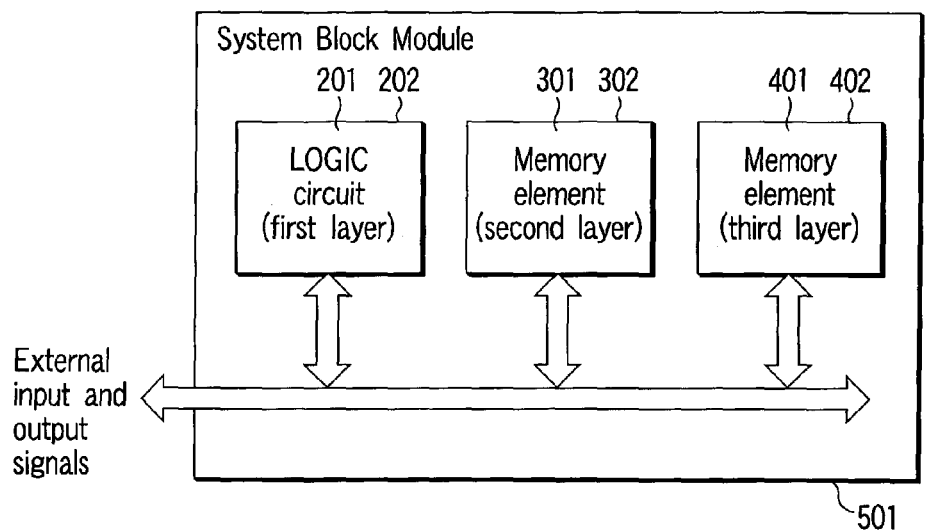

FIGS. 3A and 3B show the configuration of an SBM according to a second embodiment of the present invention in comparison with a conventional SBM. Explanation will be given, using a case where one logic circuit and two memory elements are combined. FIG. 3A shows the arrangement of the individual layers in the SBM of the second embodiment two-dimensionally. FIG. 3B shows the arrangement of the individual layers in a conventional SBM two-dimensionally. As shown in FIG. 3A, in the SBM of the second embodiment, a first circuit substrate layer (a fourth circuit substrate) 102, a second circuit substrate layer (a first circuit substrate) 202, a third circuit substrate layer (a second circuit substrate) 302, and a fourth circuit substrate layer (a third circuit substrate) 402 are arranged three-dimensionally. Then, the peripheries of the first circuit substrate layer 102, second circuit substrate layer 202, third circuit substrate layer 302, and fourth circuit substrate layer 402 are sealed with a package 501. In the second embodiment, the first circuit substrate layer 102 has a test facilitating circuit (or a changeover circuit) 101 on it. The second circuit substrate layer 202 has a logic circuit (or a first circuit element) 201 on it. The third circuit substrate layer 302 has a first memory element (or a second circuit element) 301 on it. The fourth circuit substrate layer 402 has a second memory element (or a third circuit element) 401 on it. The logic circuit 201 and the first and second memory elements 301, 401, which are semiconductor parts of different types, are each finished products.

An input and output terminal layer (not shown) is provided at the lowest layer of the package 501. The input and output terminal layer has a large number of input and output pins. The SBM exchanges external input and output signals with the external device via the input and output pins on the input and output terminal layer. The individual circuit substrate layers 102, 202, 302, 402 are connected electrically to each other in a suitable manner by interconnection lines 44 (not shown) and contacts 45 (not shown) formed in via holes or through holes.

As described above, the SBM of the second embodiment differs from the conventional SBM of FIG. 3B in the following points. In the SBM of the second embodiment, the circuit substrate layer 102 provided with the test facilitating circuit 101 is arranged at the lowest layer (or the first layer). Furthermore, the SBM of the second embodiment is so configured that the individual semiconductor parts (in the embodiment, the logic circuit 201 and the first and second memory elements 301, 401) are connected to each other via the test facilitating circuit 101. With this configuration, in the SBM of the second embodiment, the signals are always exchanged between the external device and the individual semiconductor parts via the test facilitating circuit 101.

Here, the circuit substrate layer 102 serving as the facilitation layer is composed of, for example, a PTP. The test facilitating circuit 101 on the circuit substrate layer 102 is composed of an input changeover circuit 101A as shown in FIG. 3A. The test facilitating circuit 101 is composed of a scan circuit 101B for checking the input changeover circuit 101A.

Figure 4:
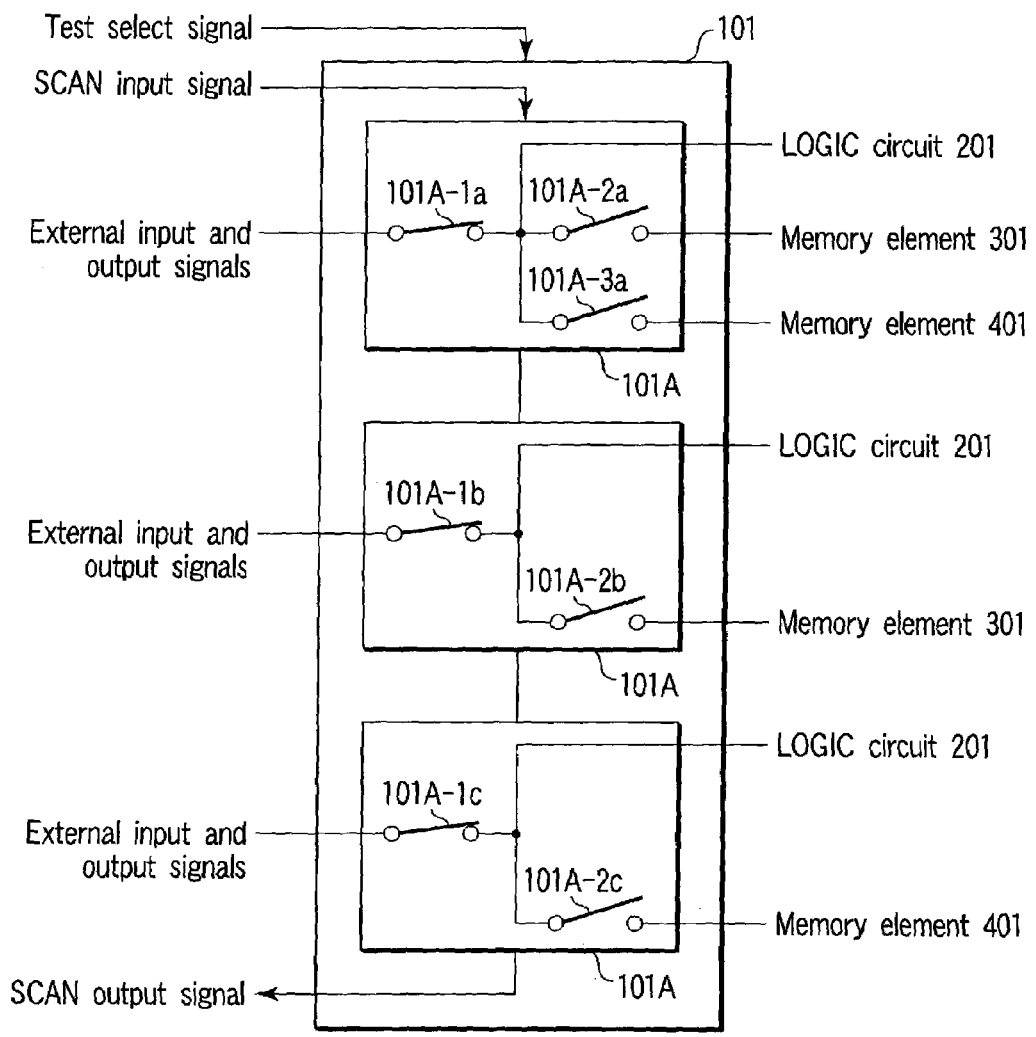
FIG. 4 shows a configuration of the test facilitating circuit shown in FIG. 3A.
Figure 6:
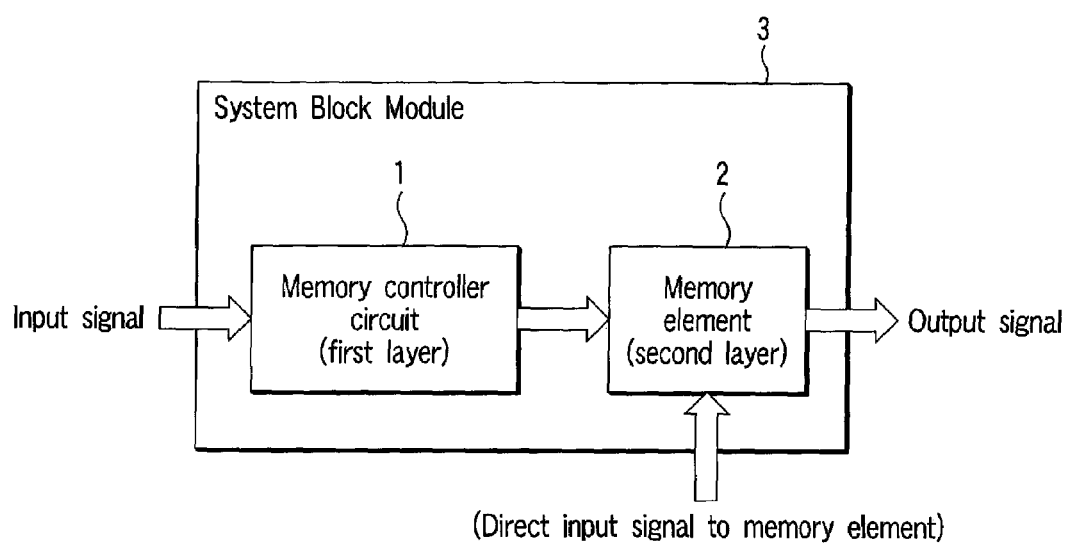
FIG. 6 is a block diagram showing another configuration of a conventional SBM two-dimensionally.

FIG. 4 schematically shows the configuration of the test facilitating circuit 101 used in the SBM. Explanation will be given, taking the single-unit test mode as an example. In the singe-unit test mode, the logic circuit 201 is tested independently. In this example, the test facilitating circuit 101 has three input changeover circuits 101A. Each of the input changeover circuits 101A is for controlling the exchange of signals between the external device and the logic circuit 210. In addition, each of the input changeover circuits 101A is for selectively controlling the exchange of signals between the external device and the first and second memory elements 301, 401. Specifically, the first input changeover circuit 101A has switch circuits 101A-1a, 101A-2a, 101A-3a. The input and output of signals of the logic circuit 201 are controlled by the turning on and off of the switch circuit 101A-1a. The input and output of signals of the first memory element 301 are controlled by the turning on and off of the switch circuits 101A-1a, 101A-2a. The input and output of signals of the second memory element 401 are controlled by the turning on and off of the switch circuits 101A-1a, 101A-3a. The second input changeover circuit 101A has switch circuits 1b, 101A-2b. The input and output of signals of the logic circuit 201 are controlled by the turning on and off of the switch circuit 101A-1b. The input and output of signals of the first memory 301 are controlled by the turning on and off of the switch circuits 101A-1b, 101A-2b. The third input changeover circuit 101A has switch circuits 101A-1c, 101A-2c. The input and output of signals of the logic circuit 201 are controlled by the turning on and off of the switch circuit 101A-1c. The input and output of signals of the second memory 401 are controlled by the turning on and off of the switch circuits 101A-1c, 101A-2c. The input and output of signals at each input changeover circuit 101A are controlled on the basis of an externally inputted test select signal (control signal).

Each of the input changeover circuits 101A is composed of, for example, a plurality of flip-flop circuits (hereinafter, abbreviated as F/F circuits) 101a corresponding to the individual switch circuits as shown in FIG. 5. On the other hand, the scan circuit 101B is configured by connecting all the F/F circuits 101a (in the scan operation mode). The scan circuit 101B checks the individual changeover circuits 101A on the basis of the output of the SCAN output signal in response to the SCAN input signal. In the scan operation, the exchange of external input and output signals between the test facilitating circuit 101 and the external device are stopped.

Here, the flow of the external input and output signals in each test mode will be explained. For example, in the normal operation test mode, the input changeover circuits 101A in the test facilitating circuit 101 connect the individual semiconductor parts to one another electrically. That is, when a comprehensive test of the entire system is carried out, the logic circuit 201 and the second memory elements 301, 401 are connected electrically to each other via the test facilitating circuit 101. Then, the exchange of external input and output signals is made between the external device and the semiconductor parts on the individual layers 202, 302, 402 by way of the test facilitating circuit 101 (101→201, 301, 401→101). The external input and outputs are test input signals from an external LSI tester and test output signals corresponding to the test input signals.

On the other hand, in the single-unit test mode, for example, when the logic circuit 201 is tested independently in the single-unit test mode, only the logic circuit 210 is connected electrically to the test facilitating circuit 101 as shown in FIGS. 4 and 5 (with the first and second memory elements 301, 401 not connected). Then, the exchange of test input signal and test output signals is made only between the external device and the logic circuit 201. on the circuit substrate layer 202 (101→201→101).

Furthermore, when the first memory element 301 is tested independently in the single-unit test mode, only the first memory element 301 is connected electrically to the test facilitating circuit 101 (with the logic circuit 201 and second memory element 401 not connected). The exchange of test input signals and test output signals is made only between the external device and the first memory element 301 on the circuit substrate layer 302 (101→301→101).

In addition, when the second memory element 401 is tested independently in the single-unit test mode, only the second memory element 401 is connected electrically to the test facilitating circuit 101 (with the logic circuit 201 and the first memory element 301 not connected). Then, the exchange of test input signals and test output signals is made only between the external device and the second memory element 401 on the circuit substrate layer 402 (101→401→101).

In the second embodiment, the test facilitating circuit 101 has been configured by providing as many input changeover circuits 101A as the number of signal lines for external input and output signals. The test facilitating circuit 101 may be configured in other ways. For instance, as in a case where a plurality of semiconductor parts are mounted on a single circuit substrate layer, the test facilitating circuit 101 may be so configured that input changeover circuits 101A are provided according to the number of semiconductor parts connected to the test facilitating circuit 101.

Next, the operation of the SBM with the above configuration will be explained by reference to FIG. 5. The normal operation mode, the normal operation test mode, the single-unit test mode, and the scan operation mode will be described.

In the normal operation mode, for example, an externally supplied test select signal is not allowed to be inputted. This causes the test facilitating circuit 101 to be set in the normal operation mode. Then, each F/F circuit 101a in the input changeover circuit 101A is set so as to enable a normal SBM operation. In this case, the logic circuit 210 and the first and second memory elements 301, 401 are connected electrically to the test facilitating circuit 101. As a result, the external input and output signals are exchanged between the external device and the logic circuit 201 and first and second memory elements 301, 401 by way of the test facilitating circuit 101.

In the normal operation test mode, for example, an externally supplied test select signal for a comprehensive test of the entire system is inputted. This sets the test facilitating circuit 101 in the normal operation test mode. Then, to carry out a comprehensive test of the entire system, each F/F circuit 101a in the input changeover circuit 101A is set. In this case, each F/F circuit 101a is connected in the same manner as in the normal operation mode. That is, the logic circuit 201 and the first and second memory elements 301, 401 are connected electrically to the test facilitating circuit 101. As a result, a comprehensive test of the entire system is carried out between the logic circuit 201 and the first and second memory elements 301, 401 according to the externally supplied test input signals via the test facilitating circuit 101. The test output signals, the result of the test, are outputted to the external device via the test facilitating circuit 101.

In contrast, in the single-unit test mode, for example, an externally supplied test select signal for a single unit test is inputted. As a result, the test facilitating circuit 101 is set in the singe-unit test mode. In this case, as described above, each F/F circuit 101a in the input changeover circuit 101A is set, depending on which one of semiconductor parts is subjected to a single unit test. That is, when the logic circuit 210 is tested independently, each F/F circuit 101a is connected in such a manner that only the logic circuit 201 is connected to the test facilitating circuit 101 as shown in FIGS. 4 and 5. In addition, when the first memory element 301 is tested independently, each F/F circuit 101a is connected in such a manner that only the first memory element 301 is connected to the test facilitating circuit 101. Furthermore, when the second memory element 401 is tested independently, each F/F circuit 101a is connected in such a manner that only the second memory element 401 is connected to the test facilitating circuit 101. In this way, any one of the logic circuit 201 and the first and second memory elements 301, 401 is connected electrically to the test facilitating circuit 101. This enables the semiconductor part to be tested according to the input of externally supplied test input signals. Each test output signal, the result of the test, is outputted to the external device via the test facilitating circuit 101.

On the other hand, in the scan operation mode, for example, a test select signal for a scan operation is externally inputted. This sets the test facilitating circuit 101 in the scan operation mode. Then, to check the input changeover circuit 101A, the individual F/F circuits 101a are connected in such a manner that they constitute the scan circuit 101B. That is, the individual F/F circuits 101a are connected in a row. In addition, the logic circuit 201 and the first and second memory elements 301, 401 are not connected to the test facilitating circuit 101. Furthermore, the exchange of external input and output signals between the test facilitating circuit 101 and the external device is stopped. In this way, the operation of the input changeover circuit 101A is checked (or verified) on the basis of the SCAN output signal outputted from the scan circuit 101B to the external device in response to the input of the SCAN input signal from the external device to the scan circuit 101B.

With this configuration, just providing the test facilitating circuit 101 enables the logic circuit 201 and the first and second memory elements 301, 401 to be tested independently without increasing the number of input and output pins considerably or providing a special test circuit inside the package. That is, after finished semiconductor parts of different types are stacked as they are one on top of another and squeezed into a single package, test input signals can be inputted directly from the external device to test the individual semiconductor parts. At that time, there is no need of making modifications to the individual semiconductor parts for single-unit testing. Therefore, not only can the TAT for an SBM on which semiconductor parts of different types are mounted be shortened, but also defects in the semiconductor parts can be found very easily. Moreover, the test facilitating circuit is added as a circuit substrate layer in the form of PTP. Therefore, although the number of stacked layers increases, an increase in the number of input and output pins is minimized. As a result, the package size hardly increases and therefore the mounting area hardly increases.

As described above, the external test signal can be inputted directly to the individual semiconductor parts. This makes it easy to test the individual semiconductor parts independently without providing a special input pin for each semiconductor part or a special test circuit for each individual test. Therefore, although not in the normal operation test, it is possible to test or analyze the semiconductor parts independently without having an adverse effect on the mounting area.

In the first and second embodiments, one semiconductor part (or circuit element) has been mounted on the circuit substrate of each layer. The present invention is not limited to this.

In the first embodiment, the circuit substrate layer 22 serving as a facilitation layer on which the input changeover circuit 21 is mounted has been set as the second layer. In the second embodiment, the circuit substrate layer 102 serving as a facilitation layer on which the test facilitating circuit 101 is mounted has been set as the first layer. However, the present invention is not restricted to these arrangements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   first, second and third circuit substrates which are stacked one upon another;
   a memory element mounted on the first circuit substrate;
   a memory controller mounted on the second circuit substrate, and electrically connected to the memory element; and
   a changeover circuit mounted on the third circuit substrate, receiving an input signal from an external device, and electrically connected to one of the memory element and the memory controller depending on operation modes having a first and a second modes,
   wherein, in the first mode, the changeover circuit supplies the input signal to the memory element by way of the memory controller, and in the second mode, the changeover circuit directly supplies the input signal to the memory element, without the input signal being supplied to the memory controller.

2. The semiconductor device according to claim 1, wherein the changeover circuit receives a control signal to change the operation mode from an external device.

3. The semiconductor device according to claim 1, wherein the first mode is a normal operation mode of the semiconductor device, and the second mode is a test mode of the memory elements.

4. The semiconductor device according to claim 1, wherein the changeover circuit includes a plurality of flip-flop circuits, the plurality of flip-flop circuits being connected to constitute a scan circuit.

5. The semiconductor device according to claim 1, wherein the first, the second and the third circuit substrates are provided in the form of a single package.

6. A semiconductor device comprising:
   a first circuit substrate;
   a first circuit element which is mounted on the first circuit substrate to receive an input signal from an external device;
   a second circuit substrate provided on the first circuit substrate;

a second circuit element which is mounted on the second circuit substrate, connected to the first circuit element and different in type from the first circuit element;

a third circuit substrate provided on the second circuit substrate; and a changeover circuit which is mounted on the third circuit substrate and changes the connection of the second circuit element and the first circuit element to the connection of the second circuit element and an external device, wherein, in a first mode, a signal output from the first circuit element is input to the second circuit element, and in a second mode, a signal output from the external device is input to the second circuit element.

7. The semiconductor device according to claim 6, wherein the third circuit substrate is a facilitation layer to facilitate a test of the second circuit element.

8. The semiconductor device according to claim 6, wherein the changeover circuit is controlled by a control signal supplied from an external device.

9. The semiconductor device according to claim 6, wherein the first circuit element is a memory controller circuit and the second circuit element is a memory element controlled by the memory controller circuit, and the changeover circuit changes an input to the memory element to input a test signal directly to the memory element, thereby to test the memory element.

10. The semiconductor device according to claim 6, wherein the first, second and third circuit substrates, the first and second circuit elements and the changeover circuit are provided in the form of a single package.

* * * * *